United States Patent [19]

Suzuki

[11] 4,024,437
[45] May 17, 1977

[54] D.C. POWER SUPPLY CIRCUIT

[75] Inventor: Masao Suzuki, Tokyo, Japan

[73] Assignee: Sony Corporation, Tokyo, Japan

[22] Filed: Nov. 4, 1975

[21] Appl. No.: 628,743

[30] Foreign Application Priority Data

Nov. 14, 1974 Japan ............... 49-137823[U]

[52] U.S. Cl. .................. 361/87; 361/18; 361/88

[51] Int. Cl.² ........................ H02H 3/20

[58] Field of Search .......... 317/31, 33 SC, 33 VR; 321/11, 14, 18, 47; 178/7.5 R, DIG. 11; 331/62

[56] References Cited

UNITED STATES PATENTS

| 3,573,598 | 4/1971 | Clarke et al. | 321/14 X |
| 3,670,234 | 6/1972 | Joyce | 321/14 X |
| 3,733,540 | 5/1973 | Hawkins | 321/18 X |
| 3,805,142 | 4/1974 | Rando | 317/33 SC |
| 3,816,809 | 6/1974 | Kuster | 321/14 |
| 3,859,586 | 1/1975 | Wadlington | 321/18 |
| 3,916,288 | 10/1975 | Hicks et al. | 321/14 |

Primary Examiner—J. D. Miller
Assistant Examiner—Patrick R. Salce
Attorney, Agent, or Firm—Hill, Gross, Simpson, Van Santen, Steadman, Chiara & Simpson

[57] ABSTRACT

A power supply protective circuit that responds to transient overloads, permanent overloads and excessive overloads to protect the power supply and the related switching transistor from damage. The circuit utilizes an astable multi-vibrator which is designed to be pulse modulated by transient overloads. In addition, the multi-vibrator is designed to be turned-off by permanent overloads and by an excessive overload condition. By this arrangement, the multi-vibrator remains in operation for normal transient overloads and does not require resetting manually when such an overload condition occurs.

5 Claims, 3 Drawing Figures

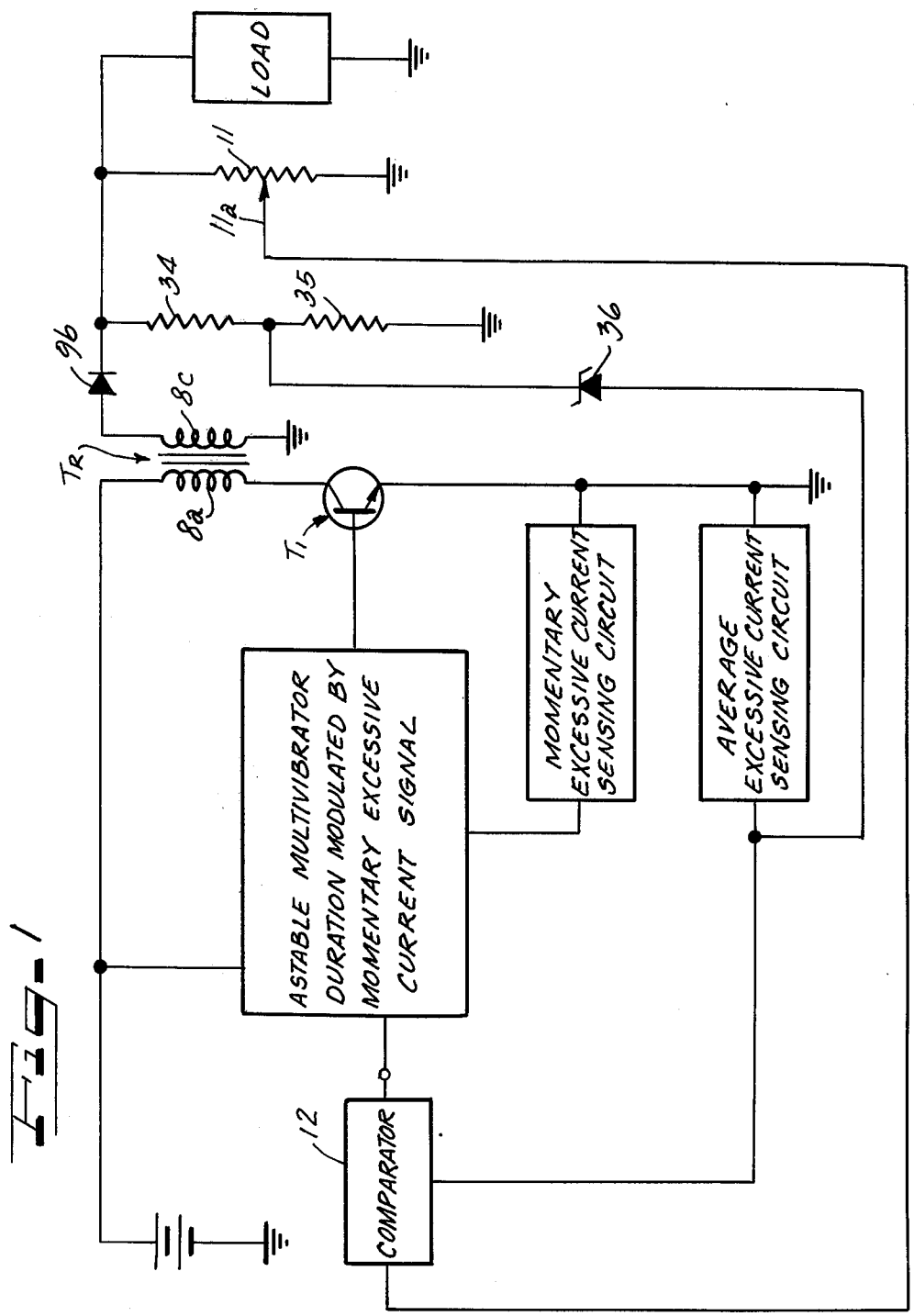

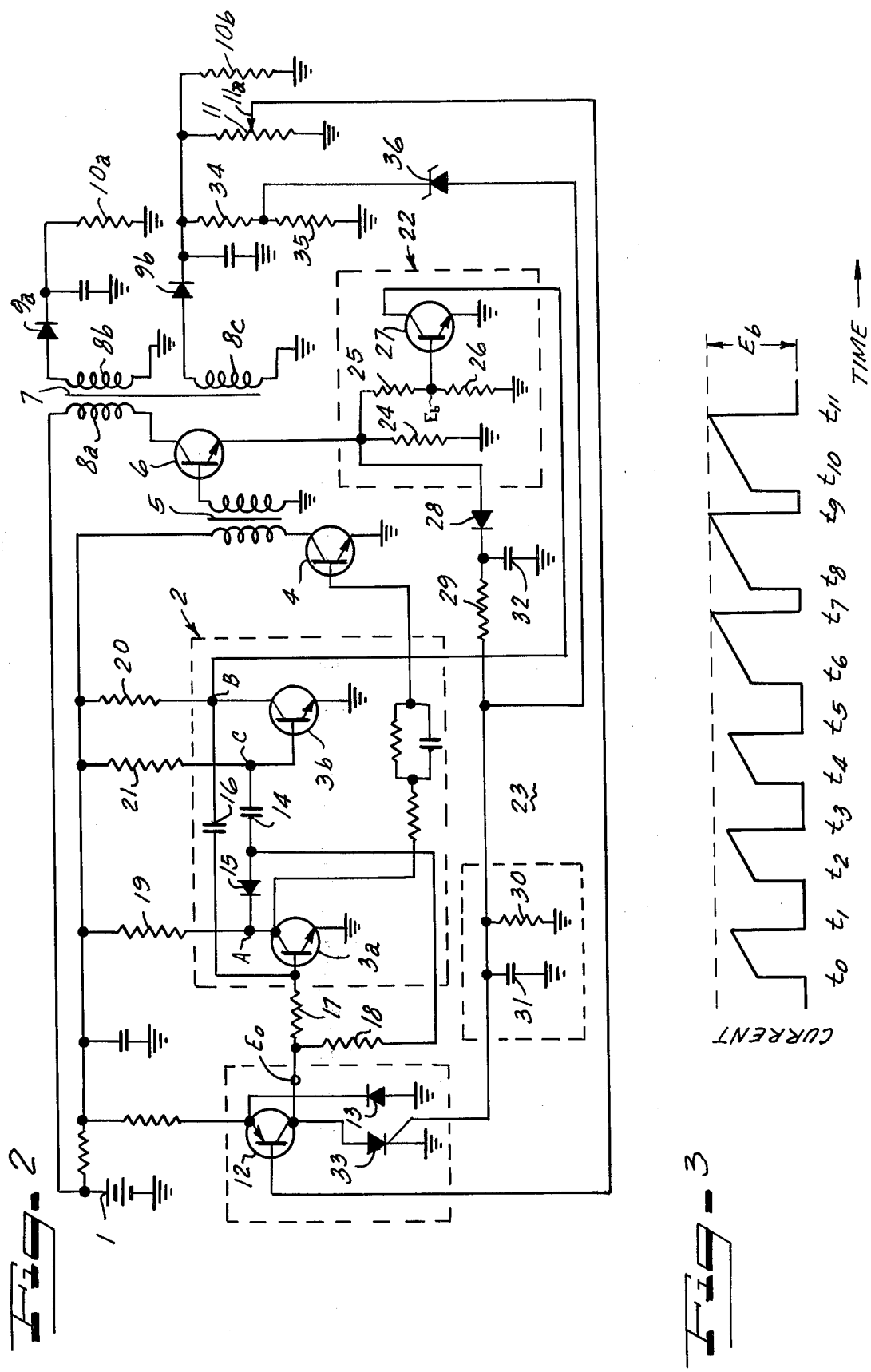

D.C. POWER SUPPLY CIRCUIT

BACKGROUND OF THE INVENTION

1. Field of the Invention

The field of art to which this invention pertains is power supply overload protection circuits and in particular to such protection circuits for protecting a power supply in the presence of transient as well as permanent overloads.

2. Description of the Prior Art

Several techniques for providing protection circuits for solid state power supplies are known in the art. These systems generally employ a fuse or other shut-down devices such as a silicon controlled rectifier, to turn off the power supply in the event of an overload. Other systems employ circuitry that shut-down the power supply when an overload is present but allow the power supply to cycle between on and off states until the overload is removed.

Although these techniques provide a degree of power supply protection, the first technique shuts-down the power supply permanently even in the event of a transient overload and requires manual resetting. The second technique provides automatic turn-on of the power supply following removal of the overload but does not provide adequate protection to the power supply when a continuing overload is present due to the fact that continuing recycling means between on and off conditions can damage the circuit and especially the output transistor.

SUMMARY OF THE INVENTION

It is a principal object of the present invention to provide an improved circuit for protecting a power supply circuit from the effect of a recurring overload.

It is a further object of this invention to provide a power supply protection circuit that maintains the power supply circuit in its off state in the event of a continuing overload.

It is another object of this invention to provide an improved power supply protection system that does not need to be reset manually following a transient overload.

A still further object of this invention is to provide an improved power supply protection circuit employing an excessive current sensing circuit to limit or suppress the "on time" duration of the output switching device at a predetermined time duration in the event of transient overloads and an average current sensing circuit to trigger the shut-down device in the event of a continuing overload.

BRIEF DESCRIPTION OF THE DRAWINGS

FIG. 1 is a diagram of a protection control circuit according to the present invention.

FIG. 2 is a schematic diagram showing the protection circuit according to the present invention employed to protect a switching mode power supply.

FIG. 3 is a waveform diagram to be used for explaining the operation of the circuit shown in FIG. 2.

DESCRIPTION OF THE PREFERRED EMBODIMENT

This invention relates generally to overload protection systems for power supplies and more particularly to overload systems that sample the condition of the load connected to the power supply to return the power supply to normal operation after a transient overload condition has been removed and to turn off the operation of the power supply when a continuous overload is present.

There are many applications wherein it is desired to protect the power supply from possible damage caused by transient and continuing overloads. One such application is in a television receiver that utilizes a switching mode power supply to power the cathode ray tube and other circuits in the receiver. In such a receiver the normal high voltage arcing which can occur at the anode or high voltage electrode of the cathode ray tube can draw sufficient transient current to damage the solid-state power supply.

In accordance with a preferred embodiment of the present invention, a silicon control rectifier is employed in conjunction with a switching mode power supply of the type employing an oscillator to provide oscillations which are subsequently amplified and transformed to a predetermined level through the use of a transformer which drives an output switching transistor which is connected in series therewith.

An excessive current sensing circuit is coupled to the output switching transistor in order to control the oscillator, thereby suppressing the on-time duration of the output switching transistor at a predetermined time duration when the current flowing in the output switching transistor exceeds a predetermined amount.

An average excessive current sensing circuit is also coupled to the output switching transistor for triggering the silicon controlled rectifier when a continuing overload is present. By this circuit operation, the silicon controlled rectifier is turned on to shut-down the operation of the oscillator and turn-off the power supply.

If the overload is transient, such as an arc in the cathode ray tube, the operation of the power supply continues as normal, however, the switching operation has a reduced time cycle.

If the overload persists, that is, continuous cycling between the on and off states of the output switching transistor, as would be the case for a short circuit, the power supply is turned-off and remains off until it is manually reset.

Referring to the drawings in greater detail, FIG. 1 shows a block diagram of the present invention and in particular shows an astable multi-vibrator which provides pulse signals to a switching transistor, T1 and to a primary winding 8a of a transformer Tr. The transformer transformer Tr, has a secondary winding 8c coupled to a rectifier 9b which in turn is coupled to a load as shown.

The emitter of the transistor T1 is coupled to a momentary excessive current sensing circuit and to an average excessive sensing circuit. The momentary excessive sensing circuit is coupled back to the astable multi-vibrator, and the average excessive sensing circuit is coupled to a comparator 12 which is used to turn-off the multi-vibrator. or oscillator when there is a continuing overload.

In addition, an excessive overload circuit provides protection for the oscillator. This circuit includes a pair of resistors 34 and 35 having a Zener diode 36 coupled to the mid-point thereof and then coupled to the comparator 12. Accordingly when an excessive overload occurs, this arrangement immediately turns-off the multi-vibrator circuit. A wiper arm 11a of a potentiometer 11 is connected directly to the comparator 12. This is the provision for the excessive overload protection, and when the load receives an excessive current, the comparator, in response to a signal from the wiper arm 11a, turns-off the multi-vibrator.

In FIG. 2, a detailed circuit of FIG. 1 is illustrated. A d.c. power supply 1 may be used as shown or it may be replaced by rectified alternating current. A pulse width modulator 2 is formed of an astable multi-vibrator comprising transistors 3a and 3b. The output of the astable multi-vibrator 2 which appears at the collector of the transistor 3a, is supplied to the base of a driver transistor 4. The output of transistor 4 is supplied through a transformer 5 to the base of a transistor 6 which operates as an output switching device.

During the on-time of the transistor 6, current from the d.c. power supply 1, which is applied to a primary winding 8a of a transformer 7, is transformed to a predetermined voltage level at secondary windings 8b and 8c. Rectifiers 9a and 9b are connected to each end of the secondary windings 8b and 8c and rectify the voltage appearing across the secondaries 8b and 8c to provide direct current voltage required for loads 10a and 10b.

In parallel with the load 10b is a potentiometer or a variable resistor 11 whose wiper supplies a voltage level E across the loads 10a and 10b to the base of a transistor 12 which is used as a comparator circuit. The emitter of the transistor 12 is connected to one terminal of a Zener diode 13, the other terminal being connected to a common potential. The output taken at the collector of transistor 12 is applied to the base of a transistor 3a which controls the astable multi-vibrator 2, thereby modulating or controlling its pulse width.

As the load voltage E at the wiper arm 11a rises, the conductivity of the transistor 12 decreases and the voltage at the collector of the transistor 12 drops, causing transistor 3a to have a longer non-conductive state. Therefore, the on-time of the transistor 4 will be longer, which, in turn, renders the off-time of the transistor 6 longer, thereby reducing the voltage applied to the loads 10a and 10b.

It follows, then that as the load voltage E drops, the circuit described above operates oppositely, so that the voltage at the load can remain at the same level.

Referring specifically to the astable multi-vibrator 2, one terminal of a capacitor 14 is connected to the base of transistor 3b, and the other terminal thereof is connected to the anode of a diode 15 having a cathode connected to collector A of the transistor 3a. The base of transistor 3a is connected through capacitor 16 to collector B of transistor 3b. The collector of transistor 12 which is connected through a resistor 17 to the base of transistor 3a is connected through resistor 18 to the anode of the diode 15. A circuit with these connections is designed to control the "duty factor", only, in response to the output of transistor 12, without changing the frequency of the astable multi-vibrator 2.

Collector A of the transistor 3a is connected through resistor 19 to the d.c. power supply 1; collector B of the transistor 3b is connected through a resistor 20 to the supply 1, and the base of transistor 3b is connected through a resistor 21 to the supply 1.

The voltage at the collector of transistor 12 is designated as Eo. When the transistor 3a is in its conductive state, its collector A is grounded, and the transistor 3b, being reverse biased by the charge stored in capacitor 14, is in its non-conductive state.

During this time, capacitor 16 is charged with the polarity shown in FIG. 2 by the d.c. power supply 1 through resistor 20, and the base to emitter junction of the transistor 3a. At such time, the capacitor 14 will be discharged by the d.c. power supply 1 through resistor 21, diode 15 and the collector to emitter junction of transistor 3a to thereafter forward bias the base to emitter junction of the transistor 3b and cause the transistor 3b to conduct.

When the transistor 3b becomes conductive, its collector B will be grounded. Then, the transistor 3a will be reverse biased by the charged stored in capacitor 16 through a loop circuit consisting of capacitor 16, the collector to emitter junction of the transistor 3b, and the emitter to base junction of the transistor 3a, resulting in the transistor 3a becoming non-conductive.

In its non-conductive state, capacitor 16 will be discharged by the voltage Eo through the resistor 17 and the collector to emitter junction of the transistor 3b, while capacitor 14 will be charged by the voltage Eo through resistor 18 and the base to emitter junction of the transistor 3b. Therefore, when the transistor 3b is in its conductive state, the voltage Eo charges capacitor 14 as well as discharging capacitor 16.

Along with the discharge of the capacitor 16, voltage at the base of the transistor 3a gradually rises, thereafter causing the transistor 3a to become conductive at a fixed level, and transistor 3b to become non-conductive. Thus, the cycling of this operation is repeated.

The discharging period of the capacitor 16 that corresponds to the conductive period of the transistor 3b is controlled by the value of Eo, and at the same time the charging voltage across the capacitor 14 is controlled by the value of Eo. As the charging voltage across the capacitor is controlled by the voltage Eo, the discharging period of the capacitor 14 which corresponds to the conductive period of transistor 3a is controlled by the voltage Eo.

When the voltage Eo increases, the conductive period of transistor 3b is shortened, and the charging voltage of the capacitor 14 is increased. As the charging voltage of the capacitor 14 is increased, the discharging period or the conductive period of the transistor 3a is lengthened.

Therefore, if the conductive period of the transistor 3b is shortened in the same amount as the lengthening of the conductive period of the transistor 3a, the output signal at B is controlled only in its duration without changing its frequency. The astable multi-vibrator of FIG. 2 is the subject of a co-pending Application, Ser. No. 533,549, filed Dec. 17, 1974.

In FIG. 2, a momentary excessive current sensing circuit 22 and an average excessive current sensing circuit 23 are connected in series to the output switching transistor 6. The momentary excessive sensing circuit 22 is designed to suppress or limit the on-time of the output switching transistor 6 in the event of an excessive overload. Also, in case the excessive current flowing through the transistor 6 persists, the average excessive current sensing circuit 23 turns-off the operation of the astable multi-vibrator.

The momentary excessive current sensing circuit 22 in this embodiment comprises resistor 24 connected in series with the transistor 6, a series circuit of resistors 25 and 26 which is connected in parallel with the resistor 24, and transistor 27 having its base connected to the junction point of the resistors 25 and 26. The emitter of transistor 27 is grounded and its collector is connected to the collector of the transistor 3b of the astable multi-vibrator.

The average excessive current sensing circuit 23 includes a rectification and filtering circuit comprising a resistor 29, resistor 30, capacitor 31 connected in parallel to resistor 30 and diode 28 which is connected in series to transistor 6. Capacitor 32 is connected between the junction point of the diode 28 and resistor 29 and ground.

In the circuit 23 the charging time constant for the capacitor 31 is designed to be sufficiently long so that only an average excessive signal develops a charge to trigger the SCR 33.

The output signal of the average excessive current sensing circuit 23, which triggers-on the SCR 33 causes the collector of the transistor 12 to be grounded.

According to this invention, the transistor 6 normally maintains the switching operation at a controlled rate, as shown by the time interval, TO – T6, in FIG. 2.

However in the presence of an overload, the on-time of the transistor 6 is lengthened as shown by the time interval T6 – T11, which means that the current conduction angle increases and the voltage Eb at the base of transistor 27 rises. If the increased voltage Eb is greater than the threshold voltage of the base to emitter junction of the transistor 27, that transistor will be made conductive. The value of the current which renders the transistor 27 conductive is selected by the ratio of resistors 25 and 26. When the transistor 27 is rendered conductive, the condition of the astable multi-vibrator 2 is switched, causing transistor 6 to become non-conductive. However, the astable multi-vibrator stays in operation and, after an interval, the transistor 6 becomes conductive again. In this way, the output switching transistor 6 maintains its switching operation at a predetermined time duration, due to the momentary excessive current sensing circuit, if the overload does not persist. If the overload persists the result is an undesirable cycling between the on and off states of the output switching transistor 6. The average sensing circuit is provided to protect against this undesirable cycling.

If the switching operation described above persists a few seconds, the voltage across capacitor 31 rises higher than that of normal level. This rise in voltage triggers the gate of the silicon controlled rectifier 33, causing the collector of the transistor 12 to be brought to a value approaching ground potential, thereby assuring substantially immediate turn-off of the astable multi-vibrator 2 and preventing the output switching transistor 6 from being damaged.

In addition to the circuits 22 and 23, a further protection circuit including a resistor 34 and a series connected resistor 35 is connected in parallel to the load 10b. The junction point of resistors 34 and 35 is connected through a Zener diode 36 to the junction point of resistors 29 and 30. Therefore, an excessive rise in voltage at the load immediately turns on the silicon controlled rectifier 33, thereby assuring a substantially immediate turn-off of the astable multi-vibrator 2 and hence protecting the output switching transistor 6.

In summary, this invention provides three protection circuits, (1) the circuit 22 which provides momentary excessive current protection without shut-down of the astable multi-vibrator, (2) the circuit 23 which provides shut-down in the case of an average excessive current and (3) the circuit 34, 35 and 36 which provides immediate shut-down for predetermined excessive overload.

It will be understood that various modifications of the preferred embodiment can be accomplished without departing from the scope of the claims set forth herein.

I claim as my invention:

1. A power supply protection circuit comprising:
    an oscillation circuit having means for changing its conduction angle in accordance with the magnitude of an input signal applied thereto,
    a d.c. power source,
    a switching device coupled to an output of said oscillation circuit for switching power from said d.c. power supply to a load in response to the output of said oscillation circuit,
    means for developing a control signal indicative of the voltage at the load and for coupling said control signal to said oscillation circuit to regulate the conduction angle thereof,
    a momentary excessive current sensing means coupled to a circuit point bearing a signal derived from said switching device for sensing momentary excessive current present in said switching device and for generating a momentary excessive current control signal,
    means for coupling said momentary excessive current control signal to said oscillation circuit for suppressing the conduction angle thereof,
    an average excessive current sensing means connected to a circuit point bearing a signal derived from said switching device for developing an average excessive current control signal,
    shut-off means for turning off said oscillation circuit in response to said average excessive current control signal, and
    means for connecting said average excessive current control signal to said shut-off means.

2. A power supply protection circuit in accordance with claim 1 wherein:
    an excessive voltage sensing means is connected to a circuit point bearing a signal indicative of the load signal and has means for developing an excessive voltage sensing control signal,
    means for coupling said excessive voltage sensing control signal to said shut-off means, and
    said shut-off means being responsive to said excessive voltage sensing control signal for turning-off said oscillation circuit.

3. A d.c. power supply protection circuit,
    a transformer having primary and secondary windings,
    a d.c. voltage source,
    a switching device,
    means for connecting said transformer primary winding and said switching device in series with said d.c. voltage source,
    oscillation means for supply switching signals with a variable time duration to said switching device to operate the same and control the duration of current in said primary winding,
    a rectifier means connected to said transformer secondary winding for rectifying a voltage induced across said tranformer secondary winding and for generating an output d.c. voltage,
    a load connected to said rectifier means to be supplied by said output d.c. voltage, voltage detecting means for detecting the output d.c. voltage of said rectifier means,
    means connected to said voltage detecting means for detecting the deviation of said output d.c. voltage from a predetermined level and for generating a control signal indicative of said deviation, means for applying said control signal to said oscillation means to regulate the time duration of said switching signals, a momentary excessive current sensing means connected to said switching device for sensing momentary current through said switching device, an average excessive current sensing means connected to said switching device for sensing average current through said switching device, means connected to said momentary current sensing means for controlling said pulse generator to suppress the time duration of said switching signals when said momentary current exceeds a predetermined level, and means connected to said average excessive current sensing means for turning off said oscillation means when said average current exceeds a predetermined level.

4. A d.c. power supply circuit in accordance with claim 3 further comprising an excessive voltage sensing means for turning off the operation of said pulse generator when said output voltage exceeds a predetermined level, and means for connecting said excessive voltage sensing means to said means being connected to said average excessive current sensing means.

5. A d.c. power supply circuit in accordance with claim 3, wherein, said switching device includes a transistor having a base, a collector, and an emitter, the base being connected to said oscillation means, the collector being connected to said primary winding of said transformer and the emitter being connected to said momentary excessive current sensing means and said average excessive current sensing means.

* * * * *